(12) United States Patent
Nagahara et al.

(10) Patent No.: US 10,025,190 B2
(45) Date of Patent: Jul. 17, 2018

(54) SUBSTRATE TREATMENT SYSTEM

(71) Applicants: TOKYO ELECTRON LIMITED, Tokyo (JP); OSAKA UNIVERSITY, Suita-shi, Osaka (JP)

(72) Inventors: Seiji Nagahara, Tokyo (JP); Gousuke Shiraishi, Koshi (JP); Satoru Shimura, Koshi (JP); Kousuke Yoshihara, Koshi (JP); Shinichiro Kawakami, Koshi (JP); Masaru Tomono, Koshi (JP); Seiichi Tagawa, Suita (JP); Akihiro Oshima, Suita (JP)

(73) Assignees: TOKYO ELECTRON LIMITED, Tokyo (JP); OSAKA UNIVERSITY, Osaka (JP)

( * ) Notice: Subject to any disclaimer, the term of this patent is extended or adjusted under 35 U.S.C. 154(b) by 0 days.

(21) Appl. No.: 15/106,915

(22) PCT Filed: Dec. 15, 2014

(86) PCT No.: PCT/JP2014/083139
§ 371 (c)(1),
(2) Date: Jun. 21, 2016

(87) PCT Pub. No.: WO2015/098596
PCT Pub. Date: Jul. 2, 2015

(65) Prior Publication Data
US 2017/0031245 A1 Feb. 2, 2017

(30) Foreign Application Priority Data

Dec. 27, 2013 (JP) ................................ 2013-271156
Nov. 18, 2014 (JP) ................................ 2014-233370

(51) Int. Cl.
*G03F 7/20* (2006.01)
*H01L 21/67* (2006.01)

(52) U.S. Cl.
CPC .............. *G03F 7/2004* (2013.01); *G03F 7/20* (2013.01); *H01L 21/67098* (2013.01);
(Continued)

(58) Field of Classification Search
CPC ............. H01L 21/67225; G03F 7/7075; G03F 7/70991
See application file for complete search history.

(56) References Cited

U.S. PATENT DOCUMENTS 5,877,843 A * 3/1999 Takagi ................ G03F 7/70358
355/30
8,289,496 B2 * 10/2012 Kim ...................... G03F 7/7075
118/58

(Continued)

FOREIGN PATENT DOCUMENTS

JP    H02-264961 A    10/1990
JP    2005-101018 A    4/2005
(Continued)

OTHER PUBLICATIONS

International Search Report of the international Searching Authority dated Mar. 17, 2015 for the corresponding International application No. PCT/JP2014/083139 (and English translation).

*Primary Examiner* — Steven H Whitesell Gordon
(74) *Attorney, Agent, or Firm* — Posz Law Group, PLC

(57) ABSTRACT

A substrate treatment system for treating a substrate, includes: a treatment station in which a plurality of treatment apparatuses which treat the substrate are provided; an interface station which directly or indirectly delivers the substrate between an exposure apparatus which is provided outside the substrate treatment system and performs exposure of patterns on a resist film on the substrate, and the substrate treatment system; a light irradiation apparatus which performs post-exposure using UV light on the resist film on the substrate after the exposure of patterns is performed; and a post-exposure station which houses the light irradiation apparatus and is adjustable to a reduced pressure or inert gas atmosphere, wherein the post-exposure station is connected to the exposure apparatus directly or (Continued)

indirectly via a space which is adjustable to a reduced pressure or inert gas atmosphere.

12 Claims, 6 Drawing Sheets

(52) U.S. Cl.
CPC .. *H01L 21/67115* (2013.01); *H01L 21/67196* (2013.01); *H01L 21/67225* (2013.01)

(56) References Cited

U.S. PATENT DOCUMENTS

| | | | |
|---|---|---|---|
| 8,356,424 B2* | 1/2013 | Kaneyama | H01L 21/67225 34/314 |
| 2009/0023284 A1* | 1/2009 | Lin | F27B 17/0025 438/618 |
| 2009/0174873 A1* | 7/2009 | Kikuchi | G03F 7/70425 355/53 |
| 2010/0273107 A1* | 10/2010 | Fonseca | G03F 7/0045 430/296 |
| 2011/0250540 A1* | 10/2011 | Huang | G03F 7/2022 430/296 |
| 2013/0005056 A1* | 1/2013 | Kim | H01L 22/12 438/16 |

FOREIGN PATENT DOCUMENTS

| | | |
|---|---|---|
| JP | 2006-078744 A | 3/2006 |
| JP | 2013-197337 A | 9/2013 |

* cited by examiner

SUBSTRATE TREATMENT SYSTEM

TECHNICAL FIELD

Cross-Reference to Related Applications

This application is based upon and claims the benefit of priority of the prior Japanese Patent Application No. 2013-271156, filed in Japan on Dec. 27, 2013, and the prior Japanese Patent Application No. 2014-233370, filed in Japan on Nov. 18, 2014, the entire contents of which are incorporated herein by reference.

The present invention relates to a substrate treatment system for treating a substrate.

BACKGROUND ART

In photolithography processing in a manufacturing process of a semiconductor device, for example, a resist film is formed as a photosensitive coating film, for example, on a substrate such as a semiconductor wafer (hereinafter, referred to as a "wafer"), and then exposure processing and developing treatment are performed on the resist film to thereby form a predetermined resist pattern on the substrate. However, with higher integration of semiconductor devices in recent years, microfabrication of the resist pattern is required. To realize the microfabrication of the resist pattern, exposure processing using a KrF excimer laser or an ArF excimer laser has been already in practical use.

Regarding such exposure processing, exposure processing using EUV (Extreme Ultraviolet) light is recently proposed to achieve further microfabrication of the pattern (refer to, for example, Patent Document 1).

PRIOR ART DOCUMENT

Patent Document

[Patent Document 1] Japanese Patent Application Laid-open No. 2006-78744

DISCLOSURE OF THE INVENTION

Problems to be Solved by the Invention

However, the EUV light is weak in energy. There is also a limit to increasing the sensitivity of the resist film in order to compensate for the weak energy. For this reason, when EUV exposure is employed, the time to expose one irradiation region becomes longer, resulting in a decrease in throughput and thereby decreasing productivity. Besides, also in EB exposure using EB (electron beam), drawing of patterns requires a long time, and there is a request to shorten the exposure time required for drawing the patterns to thereby shorten a total processing time.

The present invention has been made in consideration of the above points, and its object is to suitably form fine patterns on a substrate while suppressing a decrease in throughput in photolithography processing.

Means for Solving the Problems

To achieve the above object, the present invention is a substrate treatment system for treating a substrate, includes: a treatment station in which a plurality of treatment apparatuses which treat the substrate are provided; an interface station which directly or indirectly delivers the substrate between an exposure apparatus which is provided outside the substrate treatment system and performs exposure of patterns on a resist film on the substrate, and the substrate treatment system; a light irradiation apparatus which performs post-exposure using UV light on the resist film on the substrate after the exposure of patterns is performed; and a post-exposure station which houses the light irradiation apparatus and is adjustable to a reduced pressure or inert gas atmosphere, wherein the post-exposure station is connected to the exposure apparatus directly or indirectly via a space which is adjustable to a reduced pressure or inert gas atmosphere.

According to the present invention, the light irradiation apparatus which performs post-exposure using UV light on the resist film on the substrate which has been first subjected to exposure of patterns is provided, so that it is possible to supplementarily input energy by irradiation with UV light after the exposure of patterns by exposure with weak energy to thereby decompose an acid generating agent in the resist film so as to generate acids and promote generation of radical components. Accordingly, it is possible to reduce the irradiation amount of the light source which performs exposure of patterns, and shorten the exposure time, for example, shorten the exposure time as compared with exposure processing performed only by exposure by the light source with weak energy, thereby forming fine patterns while suppressing a decrease in throughput. In addition, the light irradiation apparatus which performs the post-exposure using the UV light on the substrate which has been subjected to the exposure of patterns is housed in the post-exposure station which is adjustable to a reduced pressure or inert gas atmosphere, and the post-exposure station is connected to the exposure apparatus directly or indirectly via a space which is adjustable to a reduced pressure or inert gas atmosphere, thus making it possible to suppress deactivation of acids and radicals from the resist film after the exposure of patterns is performed and suitably perform auxiliary exposure using the UV light.

A thermal treatment apparatus which performs heat treatment after exposure processing on the substrate after the post-exposure may be installed in a same atmosphere as an atmosphere of the post-exposure station, or a treatment space thereof in which thermal treatment is performed may be set to a same atmosphere as an atmosphere of the post-exposure station. For example, the heat treatment after exposure processing, so-called PEB, may be performed in the same atmosphere as that of the post-exposure station.

The present invention according to another aspect is a substrate treatment system for treating a substrate, including: a treatment station in which a plurality of treatment apparatuses which treat the substrate are provided; an exposure apparatus which performs exposure of patterns on the substrate; an interface station which delivers the substrate to/from the exposure apparatus; and a light irradiation apparatus which performs post-exposure using UV light on the substrate after the exposure of patterns is performed, wherein the light irradiation apparatus is provided in a section in a same atmosphere as an exposure processing unit which performs exposure processing of patterns in the exposure apparatus.

Effect of the Invention

According to the present invention, it is possible to suitably form fine patterns on a substrate while suppressing a decrease in throughput in photolithography processing.

BEST MODE FOR CARRYING OUT THE INVENTION

Figure 1:
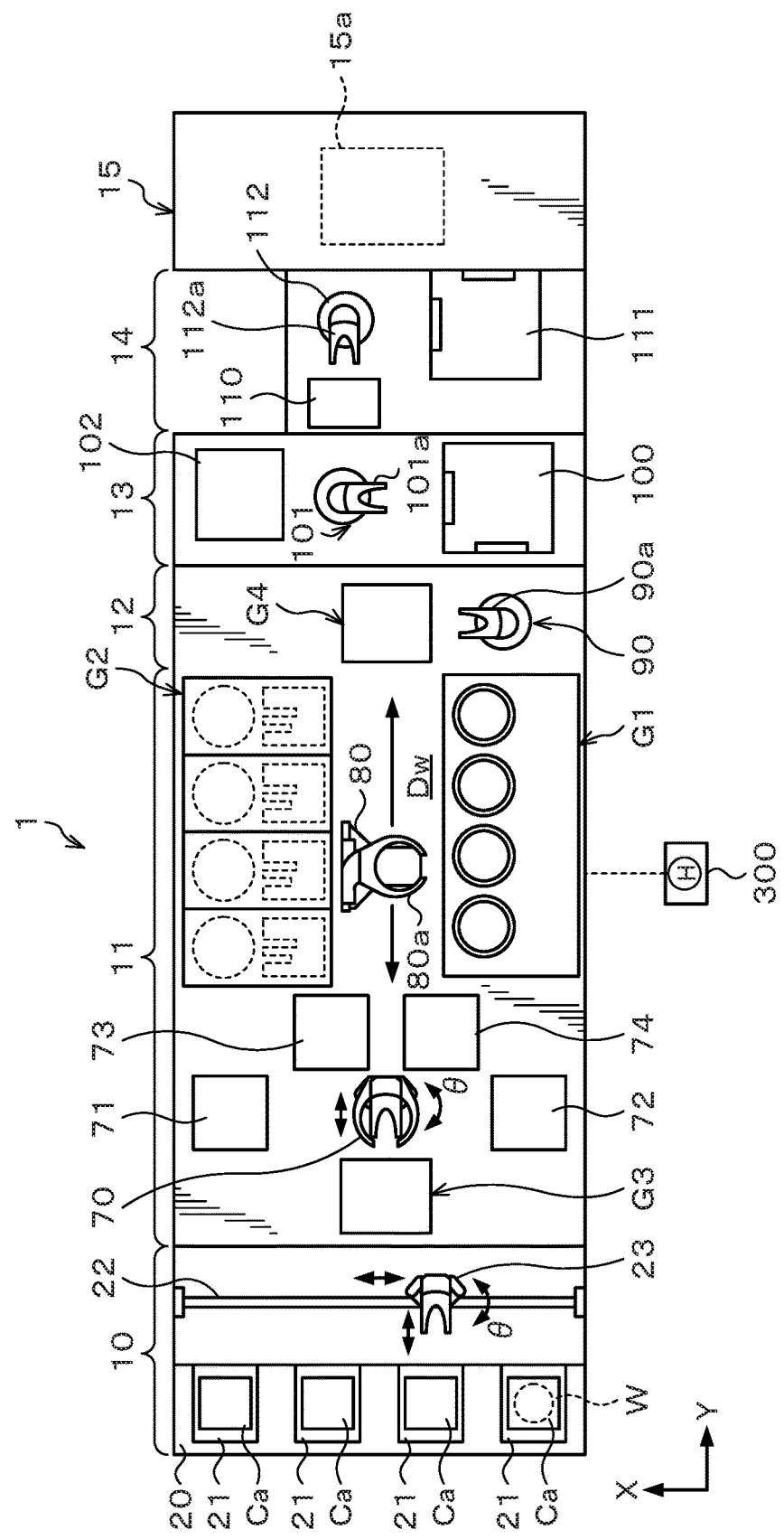
FIG. 1 A plan view schematically illustrating the outline of a configuration of a coating and developing treatment system according to an embodiment.
Figure 2:
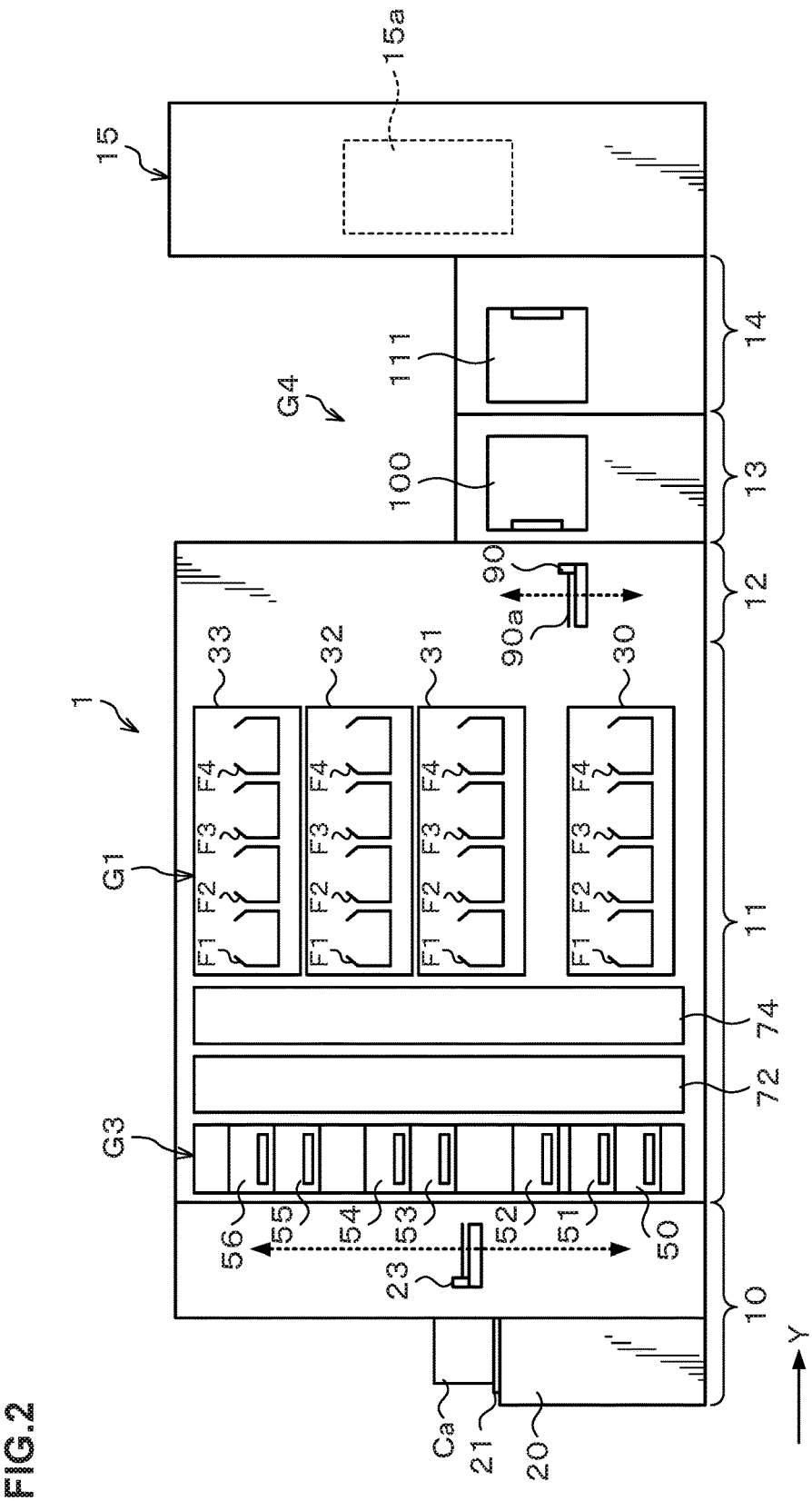
FIG. 2 A front view schematically illustrating the outline of the configuration of the coating and developing treatment system according to the embodiment.
Figure 3:
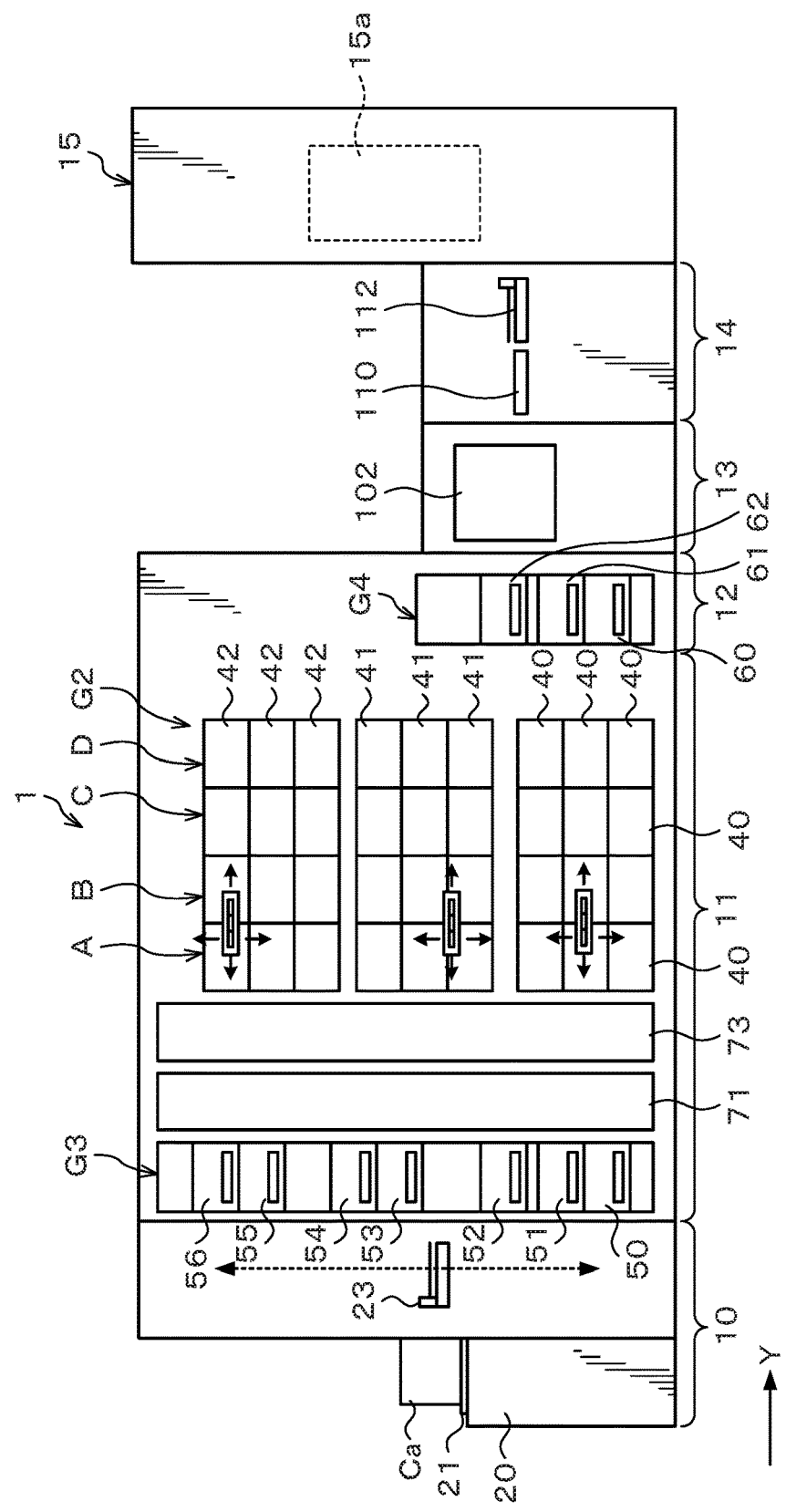
FIG. 3 A rear view schematically illustrating the outline of the configuration of the coating and developing treatment system according to the embodiment.

Hereinafter, an embodiment of the present invention will be described. FIG. 1 is an explanatory view schematically illustrating the outline of a configuration of a coating and developing treatment system 1 as a substrate treatment system according to the embodiment, and FIG. 2 and FIG. 3 are a front view and a rear view schematically illustrating the outline of an internal configuration of the coating and developing treatment system 1 respectively.

The coating and developing treatment system 1 has, as illustrated in FIG. 1, a cassette station 10 into/out of which a cassette Ca housing a plurality of wafers W is transferred, a treatment station 11 including a plurality of various treatment apparatuses which perform predetermined treatments on the wafer W, an interface station 12 provided adjacent to the treatment station 11, a post-exposure station 13 which performs post-exposure on the wafer after pattern exposure, and an interface station 14 connected to the post-exposure station 13, and an exposure apparatus 15 which performs exposure of patterns on the wafer W is provided adjacently on the positive direction side in a Y-direction of the interface station 14 of the coating and developing treatment system 1. The interface station 14 delivers the wafer W to/from the exposure apparatus 15. The exposure apparatus 15 is provided with an exposure processing unit 15a which performs exposure of patterns using EUV light on the wafer W after resist formation.

In the cassette station 10, a plurality of cassette mounting plates 21 which are provided on a cassette mounting table 20 and on which the cassettes Ca are mounted, and a wafer transfer apparatus 23 which is movable on a transfer path 22 extending in an X-direction are provided. The wafer transfer apparatus 23 is movable also in a vertical direction and around a vertical axis (in a θ-direction), and can transfer the wafer W between the cassette Ca on each of the cassette mounting plates 21 and a later-described delivery apparatus in a delivery block G3 in the treatment station 11.

In the treatment station 11, a plurality of, for example, four blocks G1, G2, G3, G4 are provided each of which includes various apparatuses. For example, in the first block G1, as illustrated in FIG. 2, a plurality of solution treatment apparatuses, for example, lower anti-reflection film forming apparatuses 30 each of which forms an anti-reflection film (hereinafter, referred to as a "lower anti-reflection film") at a lower layer of a resist film of the wafer W, resist coating apparatuses 31 each of which applies a resist solution onto the wafer W to form a resist film, upper anti-reflection film forming apparatuses 32 each of which forms an anti-reflection film (hereinafter, referred to as an "upper anti-reflection film") at an upper layer of the resist film of the wafer W, and developing treatment apparatuses 33 each of which performs developing treatment on the wafer W, are four-tiered, for example, in order from the bottom.

Each of the apparatuses 30 to 33 in the first block G1 has a plurality of cups, for example, four cups F1, F2, F3, F4 which house wafers W therein during treatments, in this order from the left side to the right side in the horizontal direction, and thus can treat a plurality of wafers W in parallel.

For example, in the second block G2, as illustrated in FIG. 3, thermal treatment apparatuses 40 each of which performs thermal treatment on the wafer W, adhesion apparatuses 41 as hydrophobic treatment apparatuses each of which performs hydrophobic treatment on the wafer W, and edge exposure apparatuses 42 each of which exposes the outer peripheral portion of the wafer W, are arranged one on top of the other in the vertical direction and side by side in the horizontal direction. The thermal treatment apparatus 40 has a hot plate which mounts and heats the wafer W thereon and a cooling plate which mounts and cools the wafer W thereon, and thereby can perform both of heat treatment and cooling treatment. Each of the treatment apparatuses 40 to 42 provided stacked as illustrated in FIG. 3 is divided into a module A, a module B, a module C, and a module D in this order from the left side to the right side in the horizontal direction, and can perform treatment on the wafer W independently in each of the modules A to D.

In the delivery block G3, a plurality of delivery apparatuses 50, 51, 52, 53, 54, 55, 56 are provided in order from the bottom. In the delivery block G4, a plurality of delivery apparatuses 60, 61, 62 are provided in order from the bottom.

As illustrated in FIG. 1, adjacent on the positive direction side in the Y-direction of the delivery block G3, a wafer transfer mechanism 70 is provided. The wafer transfer mechanism 70 has a transfer arm that is movable, for example, in the Y-direction, the θ-direction, and the vertical direction. On the positive direction side and the negative direction side in the X-direction of the wafer transfer mechanism 70, wafer inspection apparatuses 71, 72 are provided across the wafer transfer mechanism 70.

On the positive direction side in the Y-direction of the wafer transfer mechanism 70, wafer housing containers 73, 74 each of which houses a plurality of wafers W are provided. The wafer housing container 73 is disposed closer to the second block G2, and the wafer housing container 74 is disposed closer to the first block G1. The wafer transfer mechanism 70 can vertically move while supporting the wafer W to transfer the wafer W among the delivery apparatuses in the delivery block G3, the wafer inspection apparatuses 71, 72, and the wafer housing containers 73, 74. Note that the wafer inspection apparatus 71 in the embodiment measures the line width of the patterns formed on the wafer W, and the wafer inspection apparatus 72 measures an overlay error between already formed patterns and patterns exposed thereafter.

As illustrated in FIG. 1, in a region between the first block G1 and the second block G2, a wafer transfer region Dw is formed. In the wafer transfer region Dw, a plurality of wafer transfer mechanisms 80 are arranged. The wafer transfer mechanism 80 has a transfer arm 80a movable, for example, in the Y-direction, the X-direction, the θ-direction, and the vertical direction. The wafer transfer mechanism 80 can move in the wafer transfer region Dw to transfer the wafer W to the first block G1 and the second block G2 therearound, a predetermined delivery apparatus in the delivery block G4 disposed in the interface station 12, and the wafer housing containers 73, 74.

In the interface station 12, the delivery block G4 including the delivery apparatuses 60, 61, 62 as described above, and a wafer transfer mechanism 90 which can transfer in/out the wafer W to/from the plurality of delivery apparatuses 60, 61, 62, are provided. The wafer transfer mechanism 90 has a transfer arm 90a movable, for example, in the X-direction, the Y-direction, the θ-direction, and the vertical direction.

In the post-exposure station 13, a load-lock chamber 100 is provided at a position to which the arm 90a of the wafer transfer mechanism 90 in the interface station 12 has access. In the post-exposure station 13, a wafer transfer mechanism 101 is provided at a position where it has access to the load-lock chamber 100, and a light irradiation apparatus 102 as an apparatus which performs post-exposure on the wafer after pattern exposure is provided at a position to which the arm 101a of the wafer transfer mechanism 101 has access.

Figure 4:
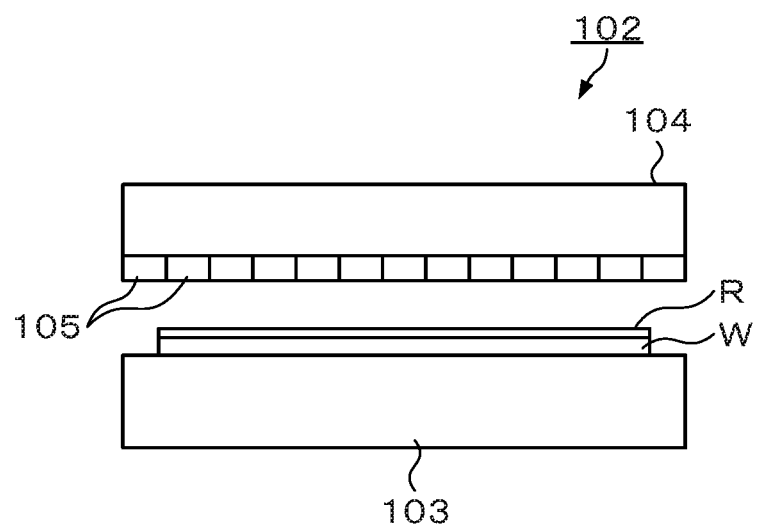
FIG. 4 A side view schematically illustrating the outline of a configuration of a light irradiation apparatus used in the coating and developing treatment system in FIG. 1.

The light irradiation apparatus 102 has, for example, a configuration illustrated in FIG. 4, and has a mounting table 103 on which the wafer W is mounted, and a light irradiation unit 104 which irradiates the wafer W on the mounting table 103 with UV light having a predetermined wavelength. In this example, the light irradiation unit 104 is configured as a one-shot exposure type apparatus which performs exposure in one shot on the entire surface of a resist R on the wafer W, and has a plurality of light sources 105, and the UV light is applied to the wafer W from each of the light sources 105. The wavelength of the UV light is, for example, 220 to 280 nm, and more preferably 248 nm or 254 nm. Note that the light irradiation apparatus 102 is configured as the one-shot exposure type apparatus which performs exposure in one shot on the entire surface of the resist R on the wafer W as described above in this example but, not limited to this, may be configured such that a line-shaped light source is employed and at least either the wafer W or the light source is moved or rotated in order for the UV light to scan on the wafer W, or another light irradiation apparatus configured to perform irradiation shot-by-shot correspondingly to patterns of the resist on the wafer W may be employed.

The post-exposure station 13 is airtightly configured and can be reduced in pressure to a predetermined pressure reduction degree, for example, $10^{-4}$ Pa to $10^{-7}$ Pa by a pressure reducing device (not illustrated). This makes it possible to suppress deactivation of acids and radicals due to minute amounts of an amine component and oxygen contained in air during irradiation with the UV light and movement in the post-exposure station 13. Note that from this viewpoint, a nitrogen gas supply source (not illustrated) and an exhaust device (not illustrated) may be connected to the post-exposure station 13 so as to set the inside of the post-exposure station 13 to an inert gas atmosphere, for example a nitrogen gas atmosphere.

The interface station 14 connected to the post-exposure station 13 is also airtightly configured, and a delivery apparatus 110 having a mounting table and so on is provided at a position to which the arm 101a of the wafer transfer mechanism 101 in the post-exposure station 13 has access, and a wafer transfer mechanism 112 which transfers the wafer W in the delivery apparatus 110 to/from a load lock chamber 111 is further provided. The wafer transfer mechanism 112 has an arm 112a.

The load lock chamber 111 in the interface station 14 is connected to the exposure apparatus 15 including the exposure processing unit 15a which performs exposure of patterns, and the load lock chamber 111 relays the interface station 14 and the exposure apparatus 15. The exposure processing unit 15a performs exposure of patterns on the resist on the wafer W, for example, using EUV light having a wavelength of 13.5 nm. In the exposure processing with such a low wavelength, energy attenuates in the presence of gas molecules in the atmosphere, and therefore the inside of the exposure apparatus 15 is reduced in pressure to a predetermined pressure reduction degree, for example, $10^{-4}$ Pa to $10^{-7}$ Pa by a pressure reducing device (not illustrated).

In the above coating and developing treatment system 1, a control unit 300 is provided as illustrated in FIG. 1. The control unit 300 controls operations of the above-described various treatment apparatuses and driving systems such as the wafer transfer mechanisms on the basis of a treatment recipe. The control unit 300 further measures the line width of patterns measured in the wafer inspection apparatus 71, and when there is a difference of an allowable value or more between the measured line width and a predetermined line width, feeds the value back to the light irradiation apparatus 102 to control the light irradiation apparatus 102 so as to produce the predetermined line width, for example, by controlling the irradiation time, the intensity of light and the like.

Note that the control unit 300 is composed of, for example, a computer including a CPU, a memory and so on and can execute programs stored, for example, in the memory to implement the coating treatment in the coating and developing treatment system 1. Note that various programs for implementing the coating treatment in the coating and developing treatment system 1 may be the ones which are stored, for example, in a storage medium H such as a computer-readable hard disk (HD), flexible disk (FD), compact disk (CD), magneto-optical disk (MO), or memory card, and installed from the storage medium H into the control unit 300.

Next, the treatment method for the wafer W performed in the coating and developing treatment system 1 configured as described above will be described together with the process of the wafer treatment performed in the whole coating and developing treatment system 1.

For the treatment of the wafer W, first, a cassette Ca housing a plurality of wafers W therein is mounted on a predetermined mounting plate 21 in the cassette station 10. Thereafter, the wafers W in the cassette Ca are sequentially taken out by the wafer transfer apparatus 23 and transferred to the delivery block G3 in the treatment station 11.

Next, the wafer W is transferred by the wafer transfer mechanism 70, for example, to the wafer housing container 73. Then, the wafer W is transferred by the wafer transfer mechanism 80, for example, to the module A of the thermal treatment apparatus 40 in the second block G2 and temperature-regulated. Thereafter, the wafer W is transferred by the wafer transfer mechanism 80, for example, to a module A of the lower anti-reflection film forming apparatus 30 in the first block G1, in which a lower anti-reflection film is formed on the wafer W. The wafer W is thereafter transferred to the module A of the thermal treatment apparatus 40 in the second block G2 and subjected to heat treatment.

The wafer W is thereafter transferred to the module A of the adhesion apparatus 41 in the second block G2 and subjected to hydrophobic treatment. The wafer W is thereafter transferred by the wafer transfer mechanism 80 to a module A of the resist coating apparatus 31, in which a resist film is formed on the wafer W. In this case, the resist film formed on the wafer W is a so-called photosensitive resist for EUV exposure. The wafer W is thereafter transferred to the module A of the thermal treatment apparatus 40 and subjected to pre-baking treatment.

Next, the wafer W is transferred to a module A of the upper anti-reflection film forming apparatus 32, in which an upper anti-reflection film is formed on the wafer W. The wafer W is thereafter transferred to the module A of the thermal treatment apparatus 40, and heated and temperature-regulated. The wafer W is thereafter transferred to the module A of the edge exposure apparatus 42 and subjected to edge exposure processing.

Next, the wafer W is transferred to the delivery block G4, transferred by the wafer transfer mechanism 90 in the interface station 12 to the load lock chamber 100 in the post-exposure station 13, then transferred by the wafer transfer mechanism 101 and the wafer transfer mechanism 112 in the interface station 14 to the load lock chamber 111, and thereafter transferred to the exposure apparatus 15. In the exposure apparatus 15, exposure of patterns is performed on the wafer W by EUV exposure by the exposure processing unit 15a.

The wafer W for which exposure of patterns has been completed is transferred to the load lock chamber 111, thereafter is set at the same pressure reduction degree as those of the interface station 14 and the post-exposure station 13, thereafter transferred by the wafer transfer mechanism 112 to the delivery apparatus 110, and then transferred by the wafer transfer mechanism 101 to the light irradiation apparatus 102.

Then, in the light irradiation apparatus 102, one-shot exposure is performed using the UV light with the predetermined wavelength on the wafer W for which the exposure of patterns using the EUV light has been completed. Thus, final resist patterns before developing treatment are formed on the wafer W.

The wafer W is thereafter transferred by the wafer transfer mechanism 80 to the module A of the thermal treatment apparatus 40 and subjected to post-exposure baking treatment. The wafer W is thereafter transferred, for example, to the cup F1 of the developing treatment apparatus 33 and subjected to developing treatment. After the developing treatment is finished, the wafer W is transferred to the module A of the thermal treatment apparatus 40 and subjected to post-baking treatment.

The wafer W is thereafter transferred to the wafer housing container 73. The wafer W is then transferred by the wafer transfer mechanism 70 to the wafer inspection apparatuses 71, 72. In the wafer inspection apparatus 71, for example, the line width of the final patterns is measured, and its measured result is outputted to the control unit 300. Further, the wafer W transferred to the wafer inspection apparatus 72 is subjected to measurement of the overlay error, and its measured result is outputted to the control unit 300.

With the coating and developing treatment system 1 according to the embodiment, the wafer W on which exposure of fine patterns is first performed using the EUV light is then subjected to the one-shot exposure using the UV light by the light irradiation apparatus 102 in the post-exposure station 13, so that the pattern exposure processing with weak energy is so-called photosensitized, whereby resist patterns with high resolution and increased contrast before developing treatment are formed on the wafer W. Accordingly, it is possible to assist the exposure using the EUV light in the exposure apparatus 15, possible to reduce the exposure time and the exposure energy of EUV by the exposure processing unit of the exposure apparatus 15, possible to improve the throughput and efficient operation of apparatuses, and possible to form fine patterns on the substrate while suppressing a decrease in throughput also in the photolithography processing using EUV.

In addition, the wafer W on which exposure of the fine patterns has been performed using the EUV light is subjected to one-shot exposure in the post-exposure station 13 which is airtightly divided from the surroundings and set to a low-oxygen atmosphere such as a predetermined reduced pressure atmosphere or an inert gas atmosphere, and therefor deactivation of generated acids and radicals is suitably suppressed. Further, the post-exposure station 13 is connected to the exposure apparatus 15 via the interface station 14 in the same atmosphere as that of the post-exposure station 13, and therefore it is possible to transfer the wafer W after the EUV exposure processing to the light irradiation apparatus 102 immediately and without damaging the fine patterns using the EUV light, and to implement predetermined UV exposure.

In the above-described embodiment, the post-exposure station 13 is configured as a section adjacent to the interface station 14 in the same atmosphere as that of the post-exposure station 13, but, as a matter of course, the post-exposure station 13 may also be integrated with the interface station 14 in the same atmosphere as that of the post-exposure station 13 and thereby configured as one post-exposure station or interface station.

Note that in the above embodiment, the wafer W which has been subjected to the one-shot exposure using the UV exposure is transferred as it is from the interface station 12 in the atmosphere on the treatment station 11 side to the thermal treatment apparatus which performs post-exposure baking treatment, but in consideration of the point that a state after the exposure of this kind of so-called photosensitive resist has not been understood yet, it is desirable to provide the thermal treatment apparatus which performs post-exposure baking treatment in the same atmosphere as that of the post-exposure station 13. In this case, it is practical to set the post-exposure station 13 and the interface station 14 not to a vacuum atmosphere but to an insert gas atmosphere such as a nitrogen gas.

Further, in the above-described embodiment, the line width of the patterns measured in the wafer inspection apparatus 71 is measured and its measured result is fed back to the light irradiation apparatus 102 via the control unit 300, so that the irradiation time, the intensity of light and the like of the light irradiation apparatus 102 can be controlled based on the measured result. By controlling the UV exposure after pattern exposure using EUV as described above, it is possible to more efficiently perform control. In other words, even when, for example, the exposure amount, time and the like of the exposure apparatus 15 are adjusted, its effect is very small, but when the UV light of the light irradiation apparatus 102 is adjusted, its effect is prominent, so that it is possible to more effectively and efficiently adjust, for example, the line width of the patterns and the like.

Figure 5:
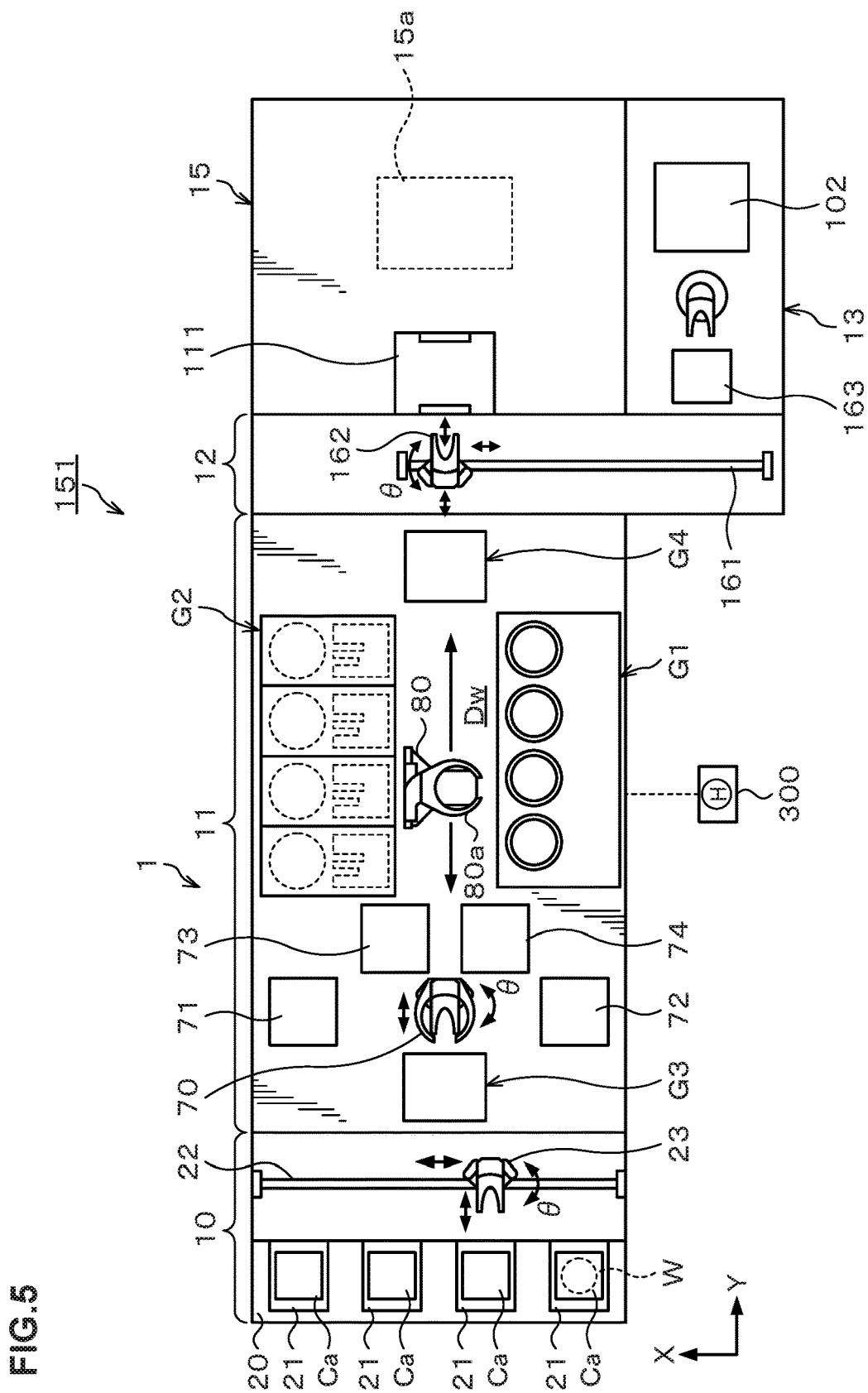
FIG. 5 A plan view schematically illustrating the outline of a configuration of a coating and developing treatment system according to another embodiment.

The post-exposure station 13 which performs post-exposure using the UV light on the wafer after pattern exposure, the interface station 14 in the same atmosphere as that of the post-exposure station 13, and the exposure apparatus 15 which performs exposure of patterns using the EUV light on the wafer W are arranged in series in a so-called linear form via the interface station 12 in the above embodiment, but may be arranged as illustrated in FIG. 5.

More specifically, in a coating and developing treatment system 151 illustrated in FIG. 5, the exposure apparatus 15 and the post-exposure station 13 are connected, in parallel with each other, to the interface station 12 adjacent to the treatment station. In this case, in the interface station 12, a wafer transfer apparatus 162 which is movable on a transfer path 161 extending in an X-direction is provided similarly to the wafer transfer apparatus 23 in the cassette station 10. The wafer transfer apparatus 162 is configured to have free access to the delivery block G4, the load lock chamber 111 of the exposure apparatus 15, and a delivery apparatus 163 having a mounting table and so on installed in the post-exposure station 13.

In this case, the inside of the interface station 12 is preferably the same atmosphere as the inside of the post-exposure station 13 as has been described above, and it is practical to set the inside of the interface station 12 and the post-exposure station 13 to an inert gas atmosphere, for example, a nitrogen gas atmosphere in consideration of the throughput, cost and so on. As a matter of course, when it is desired to install the light irradiation apparatus 102 in a reduced pressure atmosphere, only the inside of the interface station 12 may be set to the inert gas atmosphere and the delivery apparatus 163 in the post-exposure station 13 may be shifted to the above-described load lock chamber 100.

As described above, according to the coating and developing treatment system 151 illustrated in FIG. 5, the exposure apparatus 15 having light sources with different wavelengths and the post-exposure station 13 housing the light irradiation apparatus 102 are connected, in parallel with each other, to one interface station 12, so that the one interface station 12 and the one wafer transfer apparatus 162 can speedily perform processing of the pattern exposure using the EUV light and the post-exposure using the UV light, leading to high efficiency.

Figure 6:
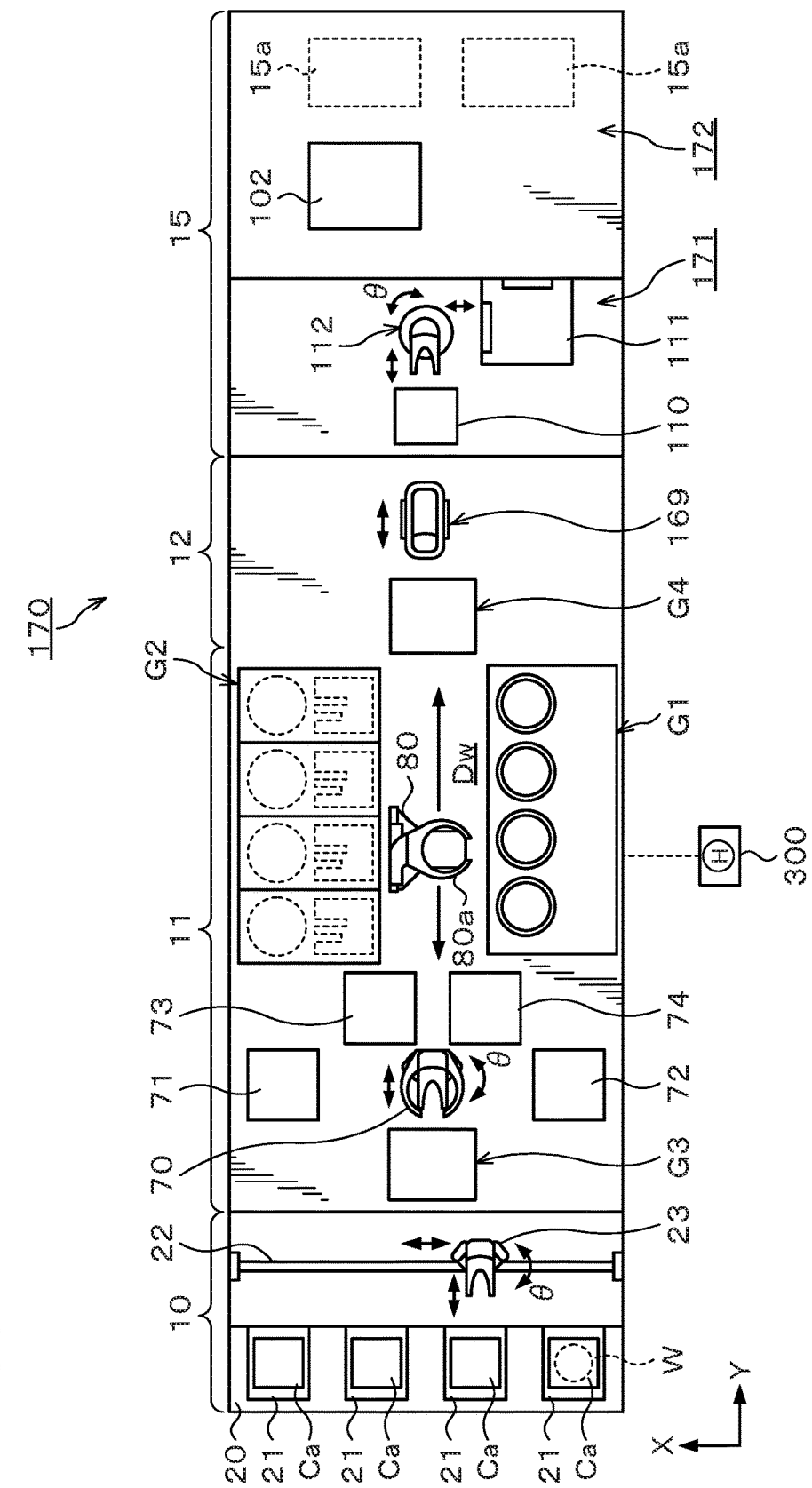
FIG. 6 A plan view schematically illustrating the outline of a configuration of a coating and developing treatment system according to another embodiment.

Further, in a coating and developing treatment system 170 having no particular post-exposure station 13, as in the existing coating and developing treatment system, the light irradiation apparatus 102 may be installed in the exposure apparatus 15 connected to the interface station 12 as illustrated in FIG. 6. More specifically, in the coating and developing treatment system 170, a transfer apparatus which reciprocates in a Y-direction as before is employed as a wafer transfer apparatus 169 installed in the interface station 12, and the wafer transfer apparatus 169 has access to the delivery block G4 in the interface station 12 and the delivery apparatus 110 in the exposure apparatus 15.

Further, the inside of the exposure apparatus 15 is airtightly divided into a first section 171 in which the delivery apparatus 110, the wafer transfer mechanism 112, and the load lock chamber 111 are installed and a second section 172 in a vacuum atmosphere, and the light irradiation apparatus 102 is installed in the second section 172 as with the exposure processing unit 15a.

According to the coating and developing treatment system 170, an existing coating and developing treatment system can be used as it is by modifying the inside of the exposure apparatus 15.

Note that the exposure apparatus 15 in the above-described embodiment includes the exposure processing unit 15a which performs exposure of patterns and is configured to perform exposure using the EUV light but, not limited to this, the present invention is applicable even to a configuration of an exposure processing unit which performs exposure using EB, exposure using ArF excimer laser light, or liquid-immersion exposure using ArF excimer laser light. For example, in the case of employing an apparatus which performs exposure processing using EB, the drawing speed of the exposure of patterns can be increased though the exposure amount is reduced, so that the compensation for the exposure amount due to reduction in exposure amount can be achieved by one-shot exposure using the UV light by the light irradiation apparatus 102 in the post-exposure station 13. The time required for the one-shot exposure by the light irradiation apparatus 102 is much shorter than the time required for the exposure processing using EB, thus making it possible to reduce the time required for the whole exposure processing in total and improve the throughput. Employment of the exposure using ArF excimer laser light or the liquid-immersion exposure using ArF excimer laser light for the exposure of patterns also makes it possible to reduce the total time required for the exposure and improve the throughput.

Preferred embodiments of the present invention have been described above with reference to the drawings, but the present invention is not limited to the illustrated embodiments. It is possible to add various changes to the illustrated embodiments within the same scope as the present invention or within an equivalent scope.

INDUSTRIAL APPLICABILITY

The present invention is useful in constructing a substrate treatment system which performs a photolithography process.

EXPLANATION OF CODES 1, 151, 170 coating and developing treatment system
10 cassette station
11 treatment station
12, 14 interface station
13 post-exposure station
15 exposure apparatus
20 cassette mounting table
21 cassette mounting plate
22 transfer path
23 wafer transfer apparatus
30 lower anti-reflection film forming apparatus
31 resist coating apparatus
32 upper anti-reflection film forming apparatus
33 developing treatment apparatus
40 thermal treatment apparatus
41 adhesion apparatus
42 edge exposure apparatus
70 wafer transfer mechanism
71, 72 wafer inspection apparatus
80 wafer transfer mechanism
90 wafer transfer mechanism
100, 111 load lock chamber
102 light irradiation apparatus
300 control unit
W wafer
Dw wafer transfer region
Ca cassette

What is claimed:
1. A substrate treatment system for treating a substrate, comprising:
a treatment station in which a plurality of treatment apparatuses which treat the substrate are provided;
an interface station which directly or indirectly delivers the substrate between an exposure apparatus which is provided outside the substrate treatment system and performs exposure of patterns on a resist film on the substrate, and the substrate treatment system;

a light irradiation apparatus which performs post-exposure with one-shot exposure of an entire surface of the substrate using UV light on the resist film on the substrate after the exposure of patterns is performed and prior to treatment by the treatment apparatus; and
a post-exposure station which houses the light irradiation apparatus and is adjustable to a reduced pressure or inert gas atmosphere,
wherein the post-exposure station is connected to the exposure apparatus directly or indirectly via a space which is adjustable to a reduced pressure or inert gas atmosphere;
wherein the post-exposure station and the exposure apparatus are located in separate chambers; and
wherein the post-exposure station is provided between the exposure apparatus and the interface station.

2. The substrate treatment system according to claim 1, wherein another interface station in a same atmosphere as an atmosphere of the post-exposure station is provided between the post-exposure station and the exposure apparatus.

3. The substrate treatment system according to claim 1, wherein the post-exposure station is connected, in parallel with the exposure apparatus, to the interface station, and
wherein the interface station is adjustable to a reduced pressure or inert gas atmosphere.

4. The substrate treatment system according to claim 1, wherein a thermal treatment apparatus which performs heat treatment after exposure processing, on the substrate after the post-exposure is installed in a same atmosphere as an atmosphere of the post-exposure station, or a treatment space thereof in which thermal treatment is performed is set to a same atmosphere as an atmosphere of the post-exposure station.

5. The substrate treatment system according to claim 1, further comprising:
an inspection apparatus which inspects the substrate which has been subjected to post-exposure by the light irradiation apparatus and then to developing treatment; and
a control unit which controls the light irradiation apparatus, based on an inspection result of the inspection apparatus.

6. The substrate treatment system according to claim 1, wherein the exposure of patterns is performed using EUV light, EB or ArF excimer laser light.

7. A substrate treatment system for treating a substrate, comprising:
a treatment station in which a plurality of treatment apparatuses which treat the substrate are provided;
an interface station which directly or indirectly delivers the substrate between an exposure apparatus which is provided outside the substrate treatment system and performs exposure of patterns on a resist film on the substrate, and the substrate treatment system;
a light irradiation apparatus which performs post-exposure with one-shot exposure of an entire surface of the substrate using UV light on the resist film on the substrate after the exposure of patterns is performed and prior to treatment by the treatment apparatus; and
a post-exposure station which houses the light irradiation apparatus and is adjustable to a reduced pressure or inert gas atmosphere,
wherein the post-exposure station and the exposure apparatus are located in separate chambers;
wherein the post-exposure station is connected, in parallel with the exposure apparatus, to the interface station; and
wherein the interface station is adjustable to a reduced pressure or inert gas atmosphere.

8. The substrate treatment system according to claim 7, further comprising:
an inspection apparatus which inspects the substrate which has been subjected to post-exposure by the light irradiation apparatus and then to developing treatment; and
a control unit which controls the light irradiation apparatus, based on an inspection result of the inspection apparatus.

9. The substrate treatment system according to claim 7, wherein the exposure of patterns is performed using EUV light, EB or ArF excimer laser light.

10. The substrate treatment system according to claim 7, wherein the post-exposure station is provided between the exposure apparatus and the interface station.

11. The substrate treatment system according to claim 10, wherein another interface station in a same atmosphere as an atmosphere of the post-exposure station is provided between the post-exposure station and the exposure apparatus.

12. The substrate treatment system according to claim 7, wherein a thermal treatment apparatus which performs heat treatment after exposure processing, on the substrate after the post-exposure is installed in a same atmosphere as an atmosphere of the post-exposure station, or a treatment space thereof in which thermal treatment is performed is set to a same atmosphere as an atmosphere of the post-exposure station.

* * * * *